United States Patent [19]
Doty

[11] Patent Number: 4,463,328
[45] Date of Patent: Jul. 31, 1984

[54] CAPACITIVELY SHORTENED COAXIAL RESONATORS FOR NUCLEAR MAGNETIC RESONANCE SIGNAL RECEPTION

[75] Inventor: F. David Doty, Columbia, S.C.

[73] Assignee: University of South Carolina, Columbia, S.C.

[21] Appl. No.: 379,116

[22] Filed: May 17, 1982

[51] Int. Cl.³ .................... H01P 7/04; G01R 33/08
[52] U.S. Cl. .................... 333/222; 324/321; 324/316; 333/223
[58] Field of Search ............. 333/222, 223, 224, 227, 333/231, 235; 324/321, 322, 316, 307, 313, 315; 361/310, 311, 320, 321, 328

[56] References Cited

U.S. PATENT DOCUMENTS

| | | | |
|---|---|---|---|
| 934,714 | 9/1909 | Deniéport | 361/310 X |
| 2,201,199 | 5/1940 | Peterson | 333/222 |
| 3,242,427 | 3/1966 | Kagan . | |
| 3,402,346 | 9/1968 | Baker . | |
| 3,434,043 | 3/1969 | Nelson . | |
| 3,681,683 | 8/1972 | Haber | 324/321 |
| 3,771,055 | 11/1973 | Anderson . | |
| 3,811,101 | 5/1974 | Kamp | 333/223 X |
| 4,275,350 | 6/1981 | Hill et al. | 324/321 |

FOREIGN PATENT DOCUMENTS 2020077 7/1970 France ................... 361/321

OTHER PUBLICATIONS

Capacitively and Inductively Foreshortened Cavities for Magnetic Resonance Spectroscopy, B. D. Guenther et al., The Review of Scientific Instruments, vol. 42, No. 4, Apr. 1971, pp. 431-434.
Comparative Study of Different Types of Resonance Volumes at Meter Wavelengths for Electronic Paramagnetic Resonance Spectrometers, M. Decorps, et al., Journal of Scientific Instruments, (Journal of Physics I), 1969, Series 2, vol. 2, (French article and translation thereof).

Primary Examiner—Paul L. Gensler
Assistant Examiner—Benny Lee
Attorney, Agent, or Firm—Brumbaugh, Graves, Donohue & Raymond

[57] ABSTRACT

A capacitively shortened coaxial resonator for making nuclear magnetic resonance measurements includes inner and outer concentrically arranged metal cylinders. The cylinders define therebetween a sample region and are shorted electrically by a conductive cap which closes one end of the inner and outer cylinders. A capacitor is connected across the cylinders at the opposite open end and functions to resonate with the inductance of a coaxial conductor formed by the short circuited cylinders. Samples placed in the sample region are mounted on an air bearing and rotated by means of air holes formed in the inner and outer cylinders.

10 Claims, 7 Drawing Figures

CAPACITIVELY SHORTENED COAXIAL RESONATORS FOR NUCLEAR MAGNETIC RESONANCE SIGNAL RECEPTION

BACKGROUND OF THE INVENTION

Nuclear magnetic resonance (NMR) is a well-known and widely used technique for obtaining detailed structural information about materials. The usual technique consists of placing a sample of the material to be analyzed in a radio frequency resonator that is located in an intense, uniform static magnetic field; often that of a superconducting solenoid. A radio frequency (rf) pulse is applied to the resonator to induce precessing transverse magnetization in an ensemble of nuclear spins. The signal then induced in the resonator by the precessing transverse magnetization in an ensemble of nuclear spins following the application of the rf pulse permits a detailed structural analysis of the sample material.

This invention pertains to improving the sensitivity of nuclear magnetic resonance measurements by means of a novel, highly sensitive capacitively shortened coaxial resonator. Heretofore, capacitively shortened coaxial resonators have been described in the articles appearing in the Journal of Scientific Instruments (Journal of Physics) Series 2, Volume 2, 1036 (1969) and the Review of Scientific Instruments, Volume 42, No. 4 (April, 1971). Also, attempts have been made to use such resonators as NMR cavities, but, in general, little attention has been paid to them.

The invention of this application provides increased sensitivity by (1) improving the quality (Q) of the resonator, (2) improving the radio frequency filling factor of the resonator, and (3) reducing the external noise contributions that result from acoustic ringing and poor shielding in conventional resonators. Single, double, triple and quadruple tuning of the resonator is also provided.

SUMMARY OF THE INVENTION

The resonator of the present invention comprises inner and outer concentrically arranged thin-walled metal cylinders having substantially the same length and which define the sample region. Preferably, the diameter of the inner cylinder ranges from about 0.5 to about 0.8 times the diameter of the outer cylinder. A removably attached metal disc closes one end of the cylinders and provides an electrical short circuit therebetween. The disc also functions to maintain the coaxial alignment of the cylinders at that end. A ring-like capacitor disc is connected between the cylinders at the opposite end to resonate the inductance of the coaxial cylinders. One, two, or three additional axially spaced capacitor discs may be connected between the cylinders to permit double, triple, or quadruple resonance experiments. In order to match the rf power to separate constant-impedance lines at each frequency of resonance, appropriate coupling links and/or coupling capacitors are provided.

In operation, a sealed, coaxial sample container is inserted in the sample region between the metal disc and ring-like capacitor disc. Typically, the length of the sample region or the distance between the discs ranges from one to two times the diameter of the outside cylinder. Air jets may be provided to support and spin the sample container about its axis. To this end, the invention incorporates an air bearing located immediately above the capacitor disc. The air may also serve the purpose of varying the temperature of the sample.

DETAILED DESCRIPTION OF THE PREFERRED EMBODIMENTS

Figure 1:
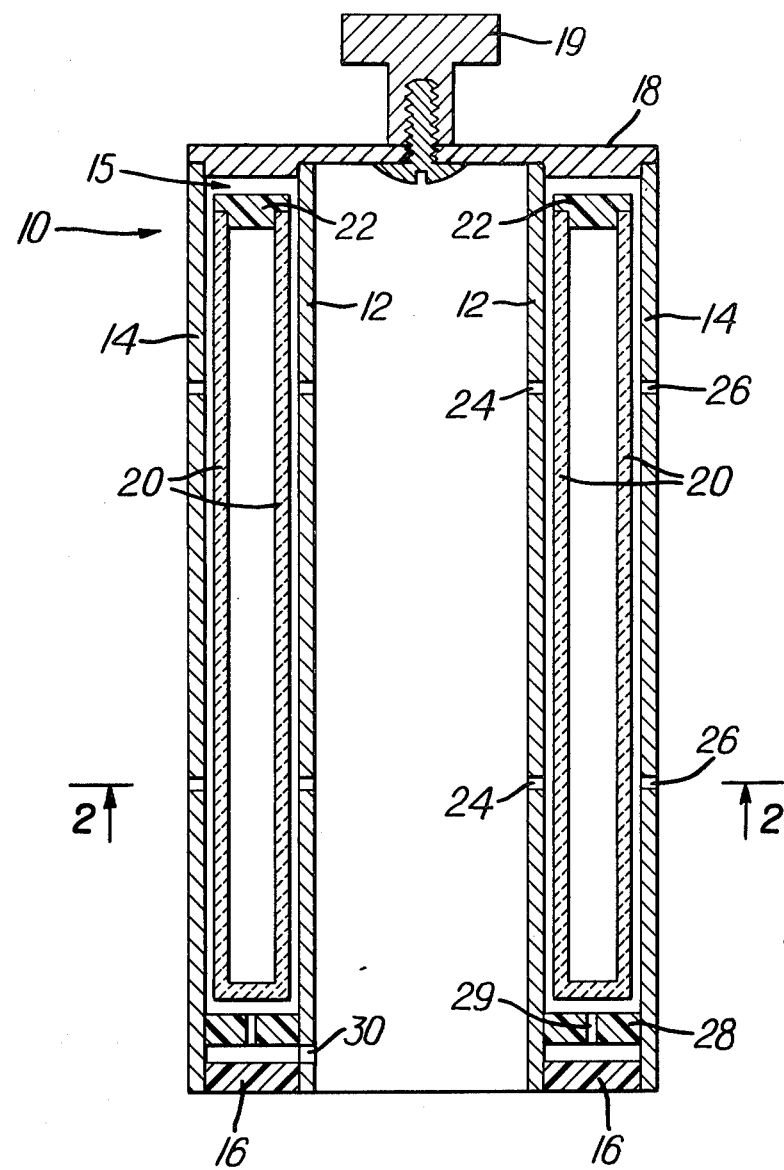
FIG. 1 is a vertical section of a single-tuned capacitively shortened coaxial resonator arranged according to the present invention.
Figure 2:
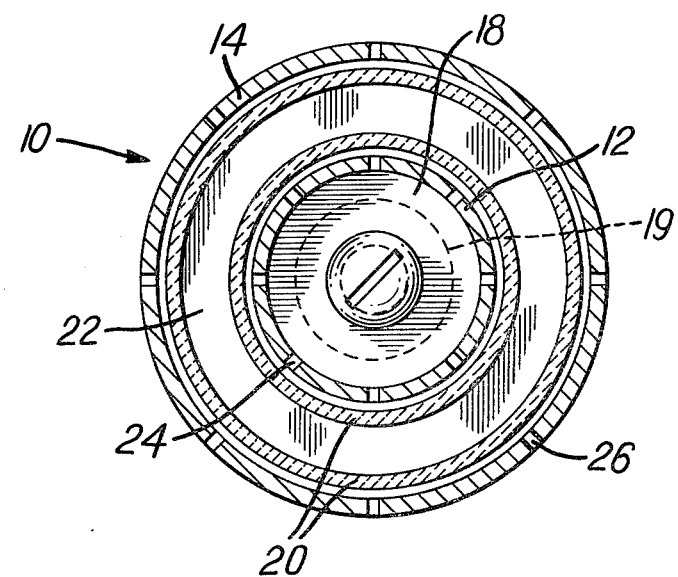
FIG. 2 is a sectional view of the FIG. 1 embodiment taken along line 2—2 and looking in the direction of the arrows.
Figure 3:
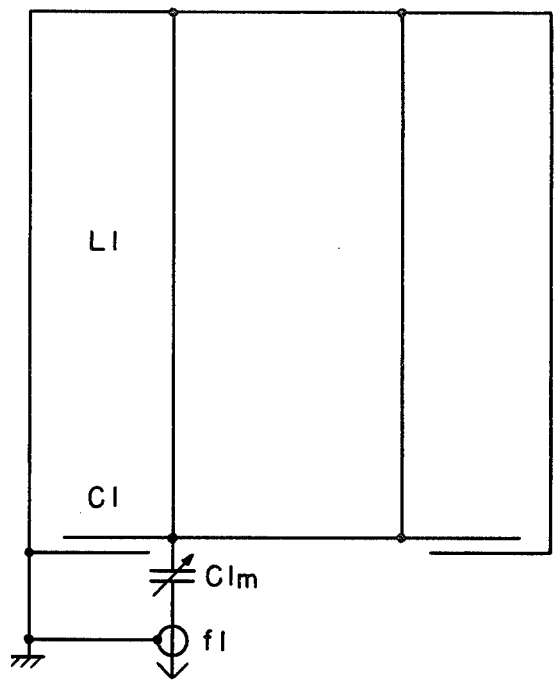
FIG. 3 is a schematic drawing of the FIG. 1 embodiment.

In the capacitively shortened coaxial resonator 10 arranged according to the present invention, as shown in FIGS. 1-3, the resonator comprises inner and outer concentrically arranged cylinders 12 and 14, respectively. The cylinders are formed of a metal, such as copper, and define therebetween a sample region 15. Preferably, the diameter of the inner cylinder 12 ranges from about 0.5 to about 0.8 times the diameter of the outer cylinder 14. Although smaller ratios would result in both higher inductance and higher Q, both of which are desirable, it is more desirable to maintain uniform rf magnetic fields over the ensemble of nuclear spins constituting the sample and to maintain a high rf filling factor. Both of these latter objectives are better realized with somewhat larger values of this ratio.

Coaxial alignment of the inner metal cylinder 12 and the outer metal cylinder 14 is maintained by means of a ring-like capacitor disc 16 soldered in place at the lower end and an annular press-fit copper cap 18 at the top end, with means such as a knob 19 provided to facilitate removal of the cap. A coaxial sample container 20 with a ring-like press-fit lid 22 is provided for containing the sample to by analyzed.

Two sets of circumferentially spaced air bearing holes 24 are formed on the inner cylinder 12 and two sets of circumferentially spaced air exhaust holes 26 are provided on the outer metal cylinder 14 to form a cylindrical air bearing. A ring-like air thrust bearing 28 containing spaced and obliquely drilled air holes 29 is cemented in place as shown above the capacitor disc 16 to provide both vertical support and torque to the sample container 20 for NMR line narrowing via slow spinning. Air is supplied to the interior of the inner cylinder 12 through the open end of the resonator and to the thrust bearing 28 through an opening 30. See my copending patent application Ser. No. 336,627 entitled "High Speed Cylindrical Nuclear Magnetic Resonance (NMR) Sample Spinner" for a description of an NMR sample spinner including air bearings.

The cylinders 12 and 14 are thin-walled, harddrawn, oxygen free, high conductivity copper and may contain up to about 0.1% silver for improved dimensional stability and creep resistance. In addition, the copper is plated with a corrosion resistant metal. The plating thickness on the exterior of the inner cylinder 12 and on the interior of the outer cylinder 14 must be sufficiently thin so as not to degrade the quality factor, Q, of the resonator. Typically, thus, a gold plate 0.0002 mm thick is applied, except that the plating thickness is increased at the top of the cylinders to allow extended wear where the cylinders 12 and 14 engage the cap 18. The paramagnetic susceptibility of the copper cylinders and cap may be cancelled by plating the exterior of the outer cylinder 14, the interior of the inner cylinder 12, and the top surface of the cap 18 with the appropriate thickness as determined by the ratio of the susceptibilities of a corrosion resistant diamagnetic material such as rhodium or iridium. Acoustic ringing of the cap 18 may be reduced by plating its lower surface with platinum to a thickness of several rf skin depths.

The thin-walled coaxial sample container 20 is fabricated from a rigid, high strength, chemically inert and low loss dielectric material, such as borosilicate glass, alumina ceramic, or polymide-amide plastic. The cap 22 is preferably made of a material, such as Teflon, polytetraflouroethylene (PTFE) or a silicone rubber, which facilitates sealing.

The essential electronic elements of the resonator, along with the elements of a coaxial cable coupled to the resonator, are illustrated schematically in FIG. 3. The resonator 10 possesses the inductance L1 of a shorted coaxial line since the two conducting cylinders 12 and 14 are shorted together. The inductance L1 resonates with the capacitance C1 of the ring-like capacitor disc 16 and the capacitance $C1_m$ of the line matching capacitor. The values of the inductance, capacitance, and resistance are determined by the well-known equations of electromagnetism:

$$L = 2h \ln\left(\frac{r_o}{r_i}\right) \times 10^{-7} \text{ Henrys/meter}$$

$$C = (4\pi^2 f^2 L)^{-1}$$

$$C_m = \left(\frac{C}{2\pi f Q Z}\right)^{\frac{1}{2}}$$

$$Q = \frac{2\pi f L}{R}$$

$$R_L = (\rho\mu_o \pi f)^{\frac{1}{2}} \left[\ln\left(\frac{r_o}{r_i}\right) + \frac{h(r_i + r_o)}{2 r_i r_o}\right]^{-1}$$

where h is the distance between the cap 18 and the capacitor 16, $r_o$ is the inside radius of the outer cylinder 14, $r_i$ is the outside radius of the inner cylinder 12, f is the resonate frequency, Q is the resonance quality factor, R is the total effective series resistance (esr) of the inductor L and the capacitor C, $R_L$ is the esr of the inductor, $\rho$ is the mean bulk resistivity of the inductor surfaces, and $\mu_o$ is the permeability of free space. All of the above equations are in standard MKS units.

The superior performance of the resonator depends to a large extent on reducing the total effective series resistance R to the minimum possible value. This is achieved by the metal plating applied to the surface of the copper cylinders 12 and 14 and to the underside of the cap 18, the latter effecting a short circuit between the cylinders. Also important is the positioning and configuration of the ring-like capacitor disc 16.

The electric field within the resonator 10 is radial in direction and, because of the extremely low inductance of the resonator, the average field is much less than conventional coil designs of comparable volume and frequency. Dielectric losses in the sample are reduced significantly and high voltage arcing problems are effectively eliminated. The rf magnetic field within the resonator is, obviously, perpendicular to the electric field.

Figure 4:
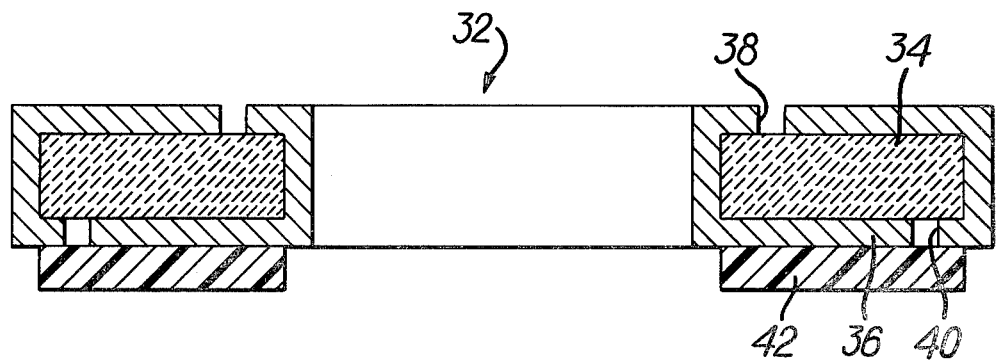
FIG. 4 is a cross section view of a ring-like capacitor disc used in the FIG. 1 embodiment and arranged according to the present invention.

FIG. 4 illustrates a low loss ring-like ceramic disc capacitor 32 arranged according to the present invention which may be incorporated into the resonator of FIG. 1. A low loss ceramic washer 34 is surrounded on all surfaces by metal 36. The metal may be applied to the ceramic by any of the well-known metalization techniques. Insulating rings 38 and 40 are then etched in the metal through to the ceramic near the inner and outer edges of the ceramic washer 34. Larger values of capacitance may be achieved by stacking several such capacitors in parallel fashion, spaced apart with dielectric washers 42.

Figure 5:
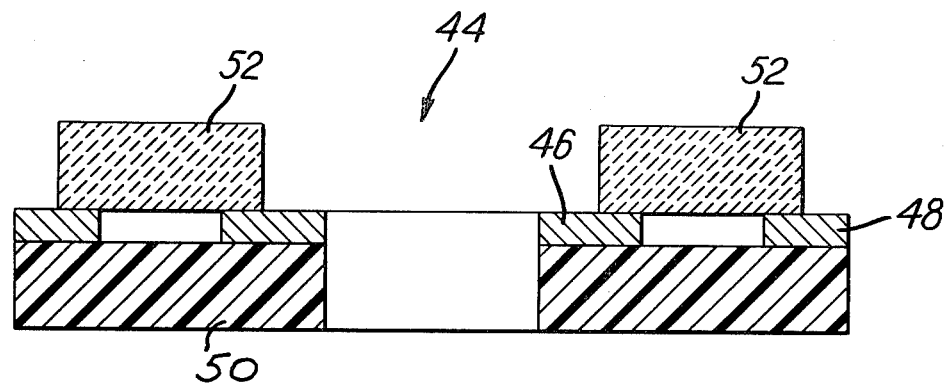
FIG. 5 is a cross section view of an alternate embodiment of a capacitor disc arranged according to the present invention.

Another preferred ring-like capacitor disc 44 is shown in FIG. 5. The disc 44 comprises an inner copper washer 46 and an outer copper washer 48, both washers being supported by a dielectric substrate washer 50, typically made from conventional single-clad circuit board. Several conventional low loss ceramic chip capacitors 52 are soldered between the copper washers 46 and 48 in a symmetrical fashion.

Figure 6:
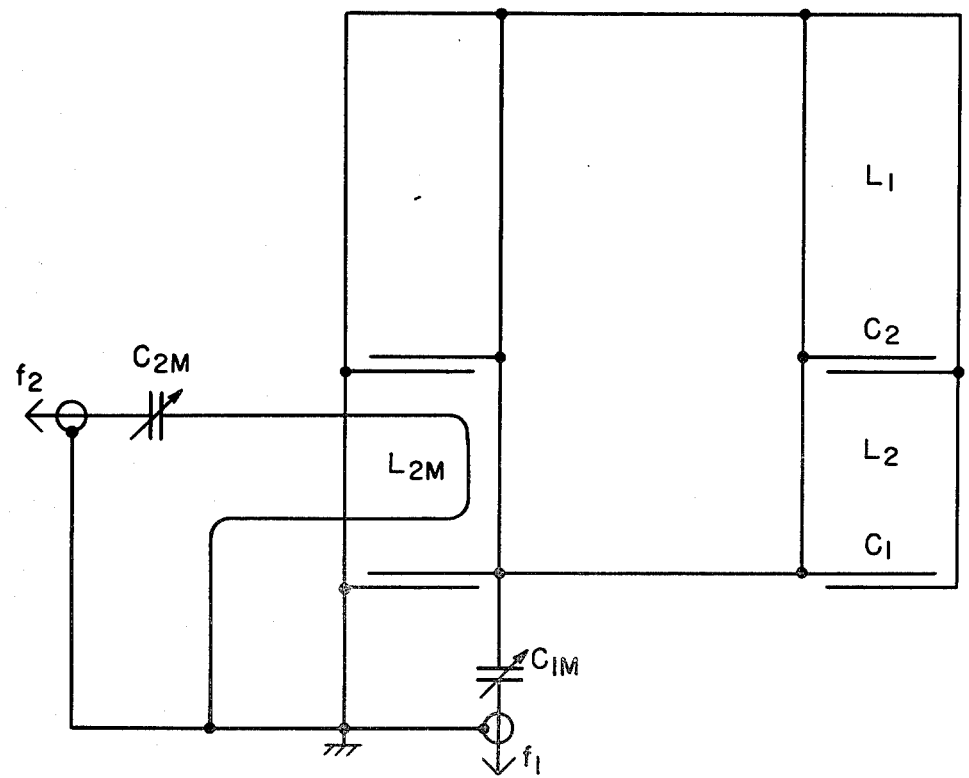
FIG. 6 is a schematic drawing of a double-tuned capacitively shortened coaxial resonator arranged according to the present invention.

FIG. 6 shows schematically a double-tuned coaxial resonator which is adapted to accommodate double resonance experiments. The area between the inner and outer cylinders is divided by a ring-like capacitor disc C2, e.g. FIG. 4, into an upper sample region L1 and a lower region L2. The latter region L2 may be filled partially with a solid dielectric to add to the structural integrity of the system. Coupling to the high frequency line f2 is accomplished by means of an inductive link $L2_m$ which intersects a portion of the high frequency flux in the lower region L2 in cooperation with a coupling capacitor $C2_m$. For experiments requiring greater sensitivity at the lower frequency, L1 must be larger than L2 and vice versa.

Figure 7:
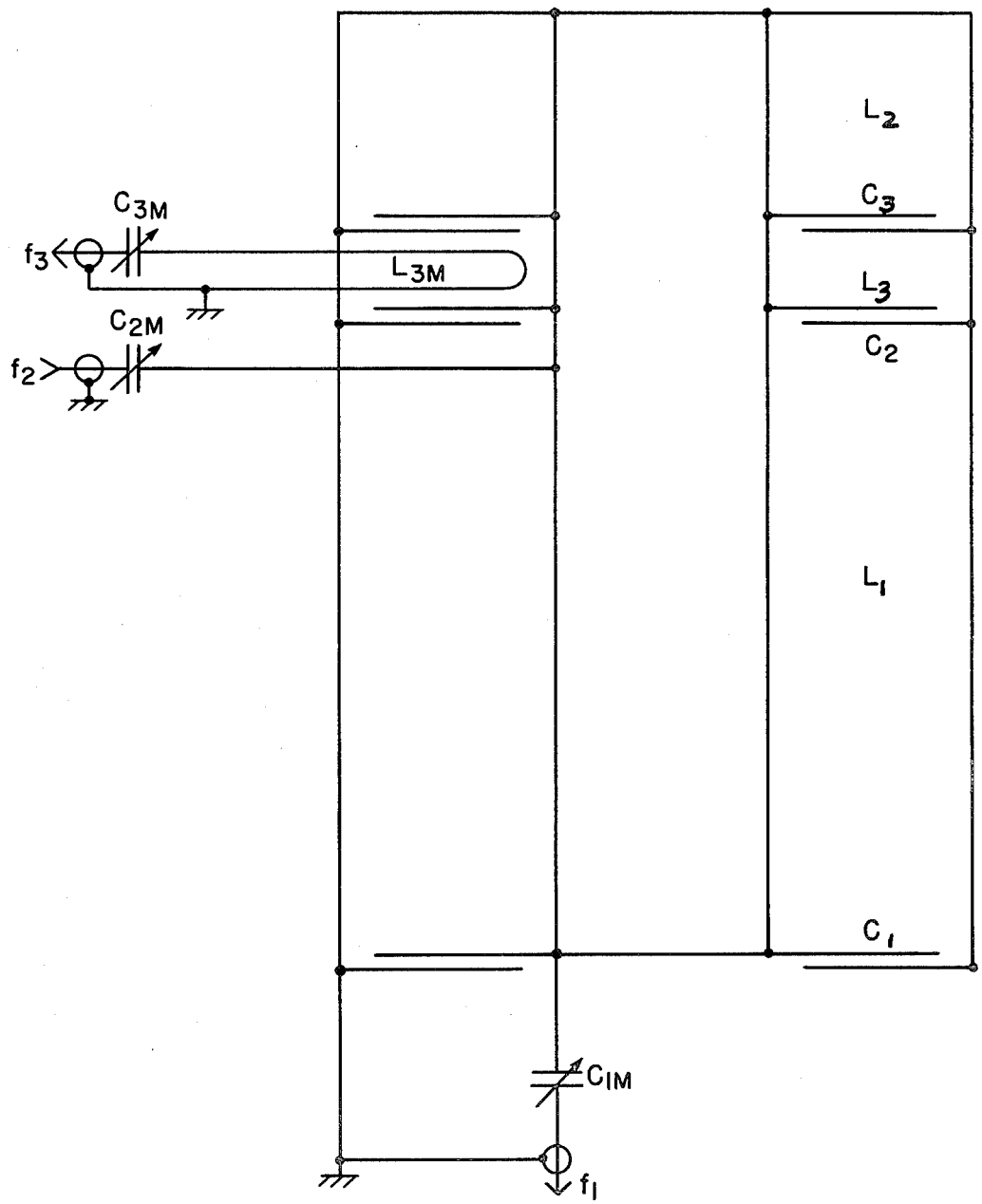
FIG. 7 is a schematic drawing of a triple-tuned capacitively shortened coaxial resonator arranged according to the present invention.

It is frequently desirable to triple tune the sample resonator so as to permit observation of one nuclide while simultaneously decoupling the effects of another nuclide and using a third nuclide for field stabilization. In this case, high sensitivity is normally required at only one of the frequencies. FIG. 7 illustrates schematically a triple tuned coaxial resonator arranged according to the present invention. In FIG. 7, a third ring-like disc capacitor $C_3$ is added in such a way so as to maintain high sensitivity at the middle frequency, $f_2$. The inductance in the sample region, $L_2$, must be greater than the inductance of the high frequency tank, $L_3$, and less than the inductance of the low frequency tank, $L_1$.

In an analogous way, a fourth annular capacitor disc may be added so as to define a fourth coaxial region and thus permit quadruple tuning.

Although the applicant's invention has been described herein with reference to specific embodiments, it will be recognized that changes and modifications may be made without departing from the spirit of the present invention. All such changes and modifications are intended to be included within the scope of the following claims.

I claim:

1. A capacitively shortened coaxial resonator for inducing transverse magnetization in an ensemble of nuclear spins, said resonator comprising open-ended inner and outer concentrically arranged metal cylinders which define therebetween a sample region for containing said ensemble of nuclear spins, wherein the ratio of the outer diameter of the inner cylinder to the inner diameter of the outer cylinder is between about 0.5 and 0.8, removable annular metallic cap means for closing one end of the inner and outer cylinder and providing an electrical short circuit therebetween, and at least one ring-like capacitor means connected across the inner and outer cylinders at the other end of the cylinders for resonating with the inductance of the coaxial conductor formed by the shorted-together cylinders.

2. A capacitively shortened coaxial resonator according to claim 1 in which the inner and outer cylinders each have axially spaced sets of circumferentially spaced openings forming a cylindrical air bearing and further comprising a thrust air bearing mounted between the capacitor and the sample region for supporting and spinning a coaxial sample container positioned in the sample region.

3. A capacitively shortened coaxial resonator according to claim 1 in which the surfaces of the cap means and the inner and outer cylinders are plated with thin layers of metal to minimize the paramagnetic susceptibility thereof.

4. A capacitively shortened coaxial resonator according to claim 1 wherein the capacitor means comprises a ceramic washer, metal applied to and surrounding the surface of the washer and a pair of concentric insulating rings formed as cutouts in the metal surrounding the ceramic washer, one ring being formed on each flat surface of the washer, with one ring nearer the inside diameter and the other ring nearer the outside diameter.

5. A capacitively shortened coaxial resonator according to claim 1 further comprising a second capacitor means between the inner and outer cylinders and axially spaced from the at least one capacitor means for defining a second region between said second capacitor means and the cap means and for producing resonance at two different frequencies.

6. A capacitively shortened coaxial resonator according to claim 5 further comprising a third capacitor means between the inner and outer cylinders and axially spaced from the second capacitor means for defining a third region between the third capacitor means and the cap means and for producing resonance at three different frequencies.

7. A capacitively shortened coaxial resonator according to claim 1 wherein the cylinders are made from copper with up to 0.1% silver.

8. A capacitively shortened coaxial resonator according to claim 1 wherein the cap means includes a layer of platinum.

9. A capacitively shortened coaxial resonator for making nuclear magnetic resonance measurements comprising open-ended inner and outer concentrically arranged metal cylinders which define therebetween a sample region, cap means for closing one end of the inner and outer cylinders and providing an electrical short circuit therebetween, and at least one capacitor means connected across the inner and outer cylinders at the other open end of the cylinders for resonating with the inductance of the coaxial conductor formed by the shorted-together cylinders, said capacitor means including a pair of concentric metal washers supported on a dielectric substrate and a plurality of ceramic chip capacitors symmetrically attached between the washers.

10. A capacitively shortened coaxial resonator for making nuclear magnetic resonance measurements comprising open-ended inner and outer concentrically arranged metal cylinders which define therebetween a sample region, cap means for closing one end of the inner and outer cylinders and providing an electrical short circuit therebetween, at least one capacitor means connected across the inner and outer cylinders at the other open end of the cylinders for resonating with the inductance of the coaxial conductor formed by the shorted-together cylinders, said capacitor means having a ring-like form and being connected between the cylinders at the end thereof opposite from the short-circuited end, and an air bearing mounted between the capacitor means and the sample region for supplying air under pressure into the sample region.

* * * * *